(12) United States Patent
Francis et al.

(10) Patent No.: US 7,943,485 B2
(45) Date of Patent: May 17, 2011

(54) COMPOSITE WAFERS HAVING BULK-QUALITY SEMICONDUCTOR LAYERS AND METHOD OF MANUFACTURING THEREOF

(75) Inventors: Daniel Francis, Oakland, CA (US); Felix Ejeckam, San Francisco, CA (US); John Wasserbauer, San Leandro, CA (US); Firooz Faili, Los Gatos, CA (US); Dubravko Babic, San Jose, CA (US)

(73) Assignee: Group4 Labs, LLC, Menlo Park, CA (US)

( * ) Notice: Subject to any disclaimer, the term of this patent is extended or adjusted under 35 U.S.C. 154(b) by 415 days.

(21) Appl. No.: 12/018,131

(22) Filed: Jan. 22, 2008

(65) Prior Publication Data

US 2008/0296586 A1  Dec. 4, 2008

Related U.S. Application Data

(60) Provisional application No. 60/881,951, filed on Jan. 22, 2007.

(51) Int. Cl.
*H01L 21/30* (2006.01)
*H01L 21/46* (2006.01)

(52) U.S. Cl. ............... 438/458; 438/455; 257/E21.57; 257/E21.568

(58) Field of Classification Search .............. 438/458, 438/459, 413, 460, 455; 257/E21.57, E21.568, 257/49
See application file for complete search history.

(56) References Cited

U.S. PATENT DOCUMENTS

| 6,794,276 | B2 | 9/2004 | Letertre et al. ............... 438/506 |
| 6,964,914 | B2* | 11/2005 | Ghyselen et al. ............ 438/458 |
| 7,282,381 | B2* | 10/2007 | Feltin et al. .................... 438/46 |
| 2004/0023468 | A1* | 2/2004 | Ghyselen et al. ............ 438/455 |
| 2006/0035440 | A1 | 2/2006 | Ghyselen et al. |
| 2006/0073640 | A1* | 4/2006 | Hu et al. ...................... 438/122 |
| 2006/0118513 | A1 | 6/2006 | Fuare et al. |
| 2008/0296586 | A1* | 12/2008 | Francis et al. ................ 428/408 |

OTHER PUBLICATIONS

PCT International Search Report Form PCT/ISA/210 for PCT/US08/51733.

* cited by examiner

*Primary Examiner* — Walter L Lindsay, Jr.
(74) *Attorney, Agent, or Firm* — David H. Jaffer; Pillsbury Winthrop Shaw Pittman LLP

(57) ABSTRACT

Method for producing composite wafers with thin high-quality semiconductor films atomically attached to synthetic diamond wafers is disclosed. Synthetic diamond substrates are created by depositing synthetic diamond onto a nucleating layer deposited on bulk semiconductor wafer which has been prepared to allow separation of the thin semiconductor film from the remaining bulk semiconductor wafer. The remaining semiconductor wafer is available for reuse. The synthetic diamond substrate serves as heat spreader and a mechanical substrate.

29 Claims, 13 Drawing Sheets

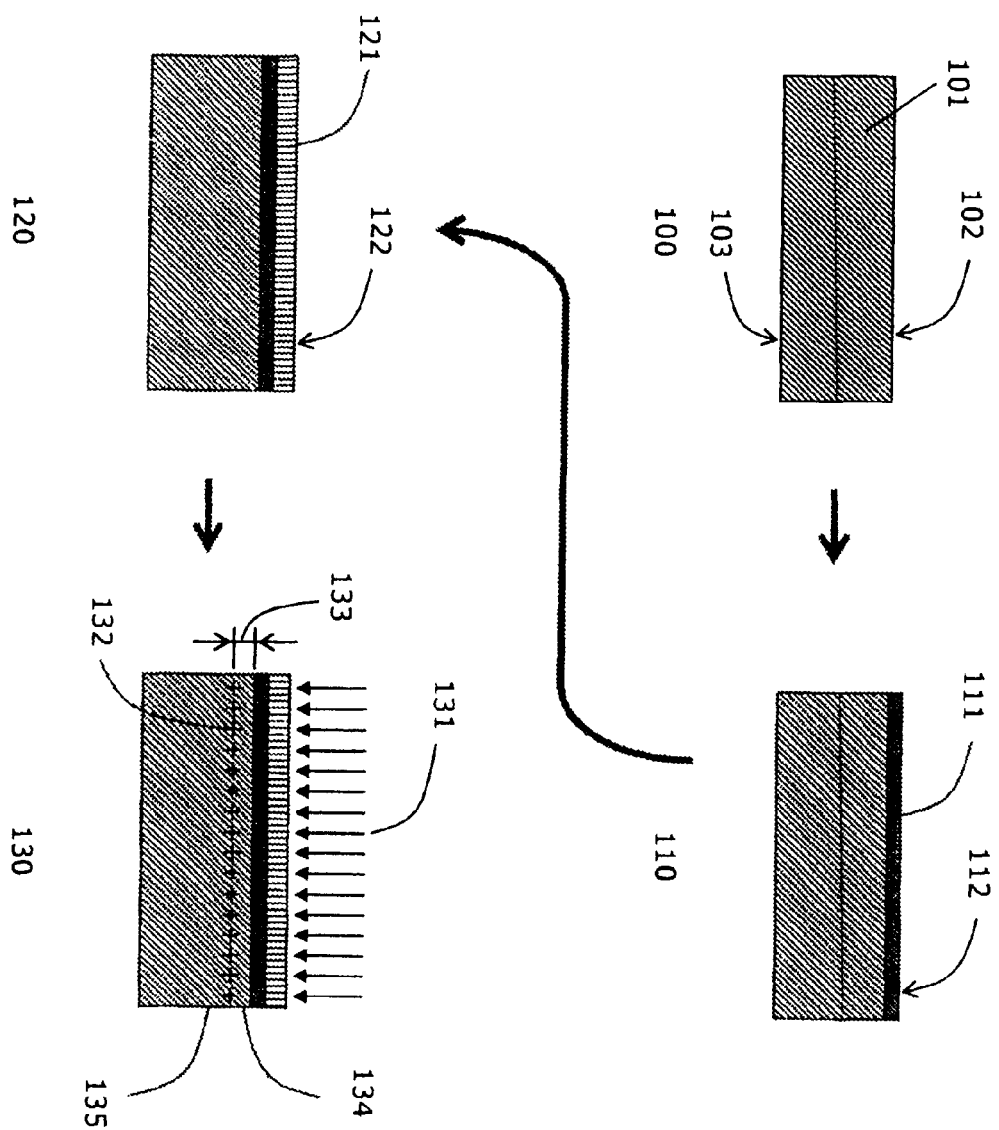
FIG. 1/1

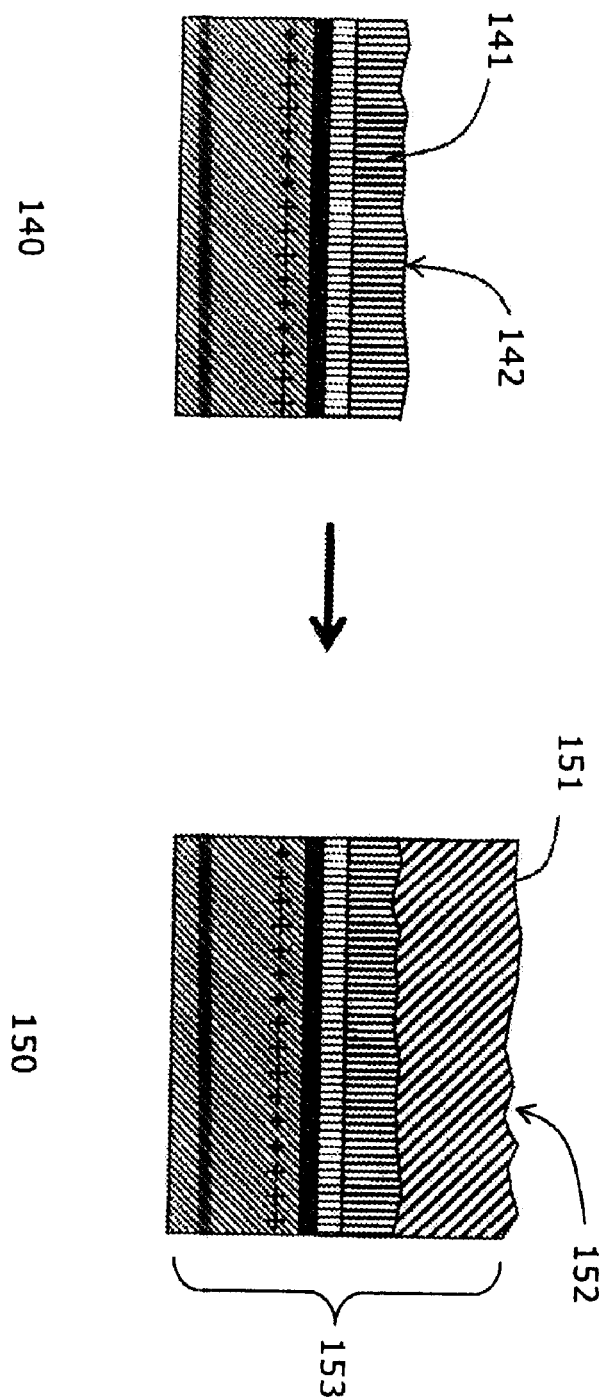
FIG. 1/2

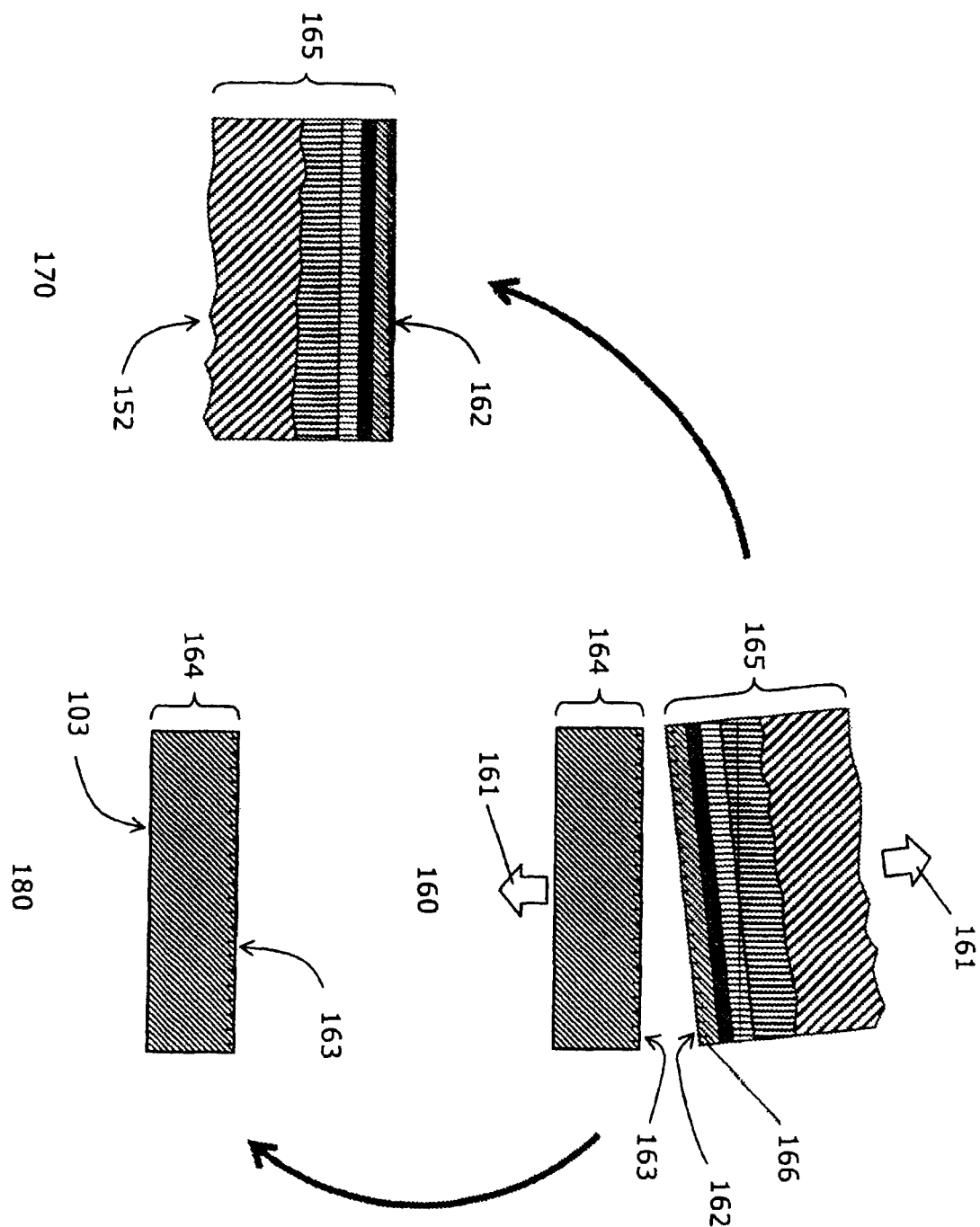
FIG. 1/3

COMPOSITE WAFERS HAVING BULK-QUALITY SEMICONDUCTOR LAYERS AND METHOD OF MANUFACTURING THEREOF

RELATED APPLICATIONS

This application claims benefit of U.S. Provisional Patent Application Serial No. 60/881,951 filed Jan. 22, 2007.

FIELD OF THE INVENTION

The present invention relates to the manufacture of bulk-quality semiconductor thin films on synthetic diamond by transferring mentioned semiconductor films from bulk single-crystal semiconductor wafer onto synthetic diamond substrate. The transfer of said semiconductor layer may be repeated so that a multiplicity of diamond substrates with atomically attached semiconductor layers are manufactured from a single bulk semiconductor wafer. More specifically, this invention is related to gallium nitride semiconductor thin films and bulk-grown wafers.

BACKGROUND OF THE INVENTION

Gallium nitride (GaN) films are typically grown using metal-organic chemical vapor deposition (MOCVD) process on one of several available substrates. The historically first and most common substrate material used for growing GaN has been sapphire (hexagonal aluminum oxide) [11]. Although many good gallium-nitride electronic and optoelectronic devices have been grown on sapphire, this crystal is not lattice matched GaN, which results in grown films with relatively high dislocation density. Furthermore, sapphire has low thermal conductivity with respect to GaN and many other substrates used for growth of GaN layers. Consequently, a substantial improvement in device performance is expected with the development of gallium nitride on other substrates that are better lattice-matched substrates and have high thermal conductivity. Other substrates commonly used that have better thermal conductivity than sapphire, but are still not lattice-matched to GaN are silicon (Si), silicon carbide (SiC), and aluminum nitride (AlN). Due to the lattice mismatch the dislocation density of GaN films grown on above mentioned substrates is high—greater than 1E9 cm-2 in some cases. This is a significant disadvantage for the development of high-performance semiconductor devices that require dislocation densities less than 1E6 cm-2 to realize high mobility and/or low non-radiative recombination rates.

Growth of Low Dislocation-Density Gallium Nitride

Growth of GaN crystal on wafers that are not lattice-matched to GaN results in dislocations embedded in the film. These dislocations terminate at the top surface of the grown structure where the electronic or optoelectronic devices are formed, thereby adversely affecting the performance of electronic and optical devices. Dislocation density, measured in number of dislocations per unit area, is an essential property of single-crystal semiconductor surfaces for manufacturing of optical and electronic devices. A dislocation density lower than 1E6 cm-2 is considered low, while dislocation densities of 1E4 cm-2 are considered very low and are presently common in, for example, commercially available gallium arsenide wafers, but can be obtained in gallium nitride as well. Other properties relevant to growth of epitaxial layers are macroscopic defect density, which is typically below 25 cm-2 and full-width half maximum (FWHM) of double-crystal X-ray rocking curves, which for high-quality gallium nitride is below 100 arcsec.

Dislocation densities as low as 1E4 cm-2 can be obtained with GaN layers growing on bulk GaN wafers. High quality electronic and optical devices can then be grown on top of such wafers using MOCVD [2]. The disadvantage of bulk GaN wafers is their high cost [1]: They are grown either in boules [16] (similar to silicon, however, the boules are significantly smaller than those used to grow silicon or gallium arsenide due to process limitations) or as thick epitaxial layers on sapphire substrates where the substrate is later removed. Each wafer of bulk GaN today costs almost one hundred times more than the wafers conventionally used for GaN growth, for example, sapphire. Each device coming from such a wafer hence carries a significant cost of material (the bulk GaN wafer) most of which is actually not being used: Only the top surface of the gallium nitride wafer is used for growing active devices; the vast majority of the wafer volume is used as a carrier and not for its electronic properties—it is thereby wasted.

It is clear that there is a need in the industry to provide layers of bulk-quality gallium nitride with low dislocation density for growth of active devices, but at a cost that is comparable or lower than that of present conventional GaN substrates and preferably at a cost that is comparable to that of silicon. Additionally, a process that would allow the use of thin films of bulk-grown GaN rather than wasting an entire wafer for a single layer of devices would be preferred.

Thermal Management

Thermal management in semiconductor devices and circuits is a critical design element in any manufacturable and cost-effective electronic and optoelectronic product. This is more so the case with high power devices, such as, high-brightness light-emitting diodes, high-power lasers, output-stage electrical signal amplification in microwave devices, and power electronics. The goal of an efficient thermal design is to lower the operating temperature of such electronic or optoelectronic devices while maximizing performance (power and speed) and reliability. Gallium nitride material system has been used recently to fabricate microwave transistors with high-electron mobility (necessary for high-speed operation), high breakdown voltage (necessary for high power), and relatively high thermal conductivity (greater than GaAs, InP). Gallium nitride devices have also been investigated for light-emitting diodes for solid-state illumination as well as for medical and environmental laser applications.

Because GaN devices offer high current density and high voltage operation, they exhibit larger total power losses due to parasitic resistances and the inefficiency inherent to the amplification process. Although bulk GaN has low defect density, its applications in high power electronics and high-brightness light-emitting diodes is still limited by high temperature resulting from high power dissipation. These devices still require better thermal properties than GaN can offer. Gallium nitride thermal conductivity (1.3-2.25 W/Kcm) is lower than that of silicon carbide (3.5 W/Kcm).

In all of these applications, heat removal has conventionally been accomplished by placing the electronic device, optical device or integrated circuit on top of a heat sink [5]. A heat sink is a substrate or device for the absorption or dissipation of unwanted heat (as from a process or an electronic device). Most often, the heat sinks are copper blocks attached to a water-cooling system, aluminum fins, or a micro-channel cooler. Synthetic diamond heat sinks are being actively investigated because of diamond's superior thermal properties in respect to all other materials in nature [5]. Conventional heat removal systems for transistors and light-emitting devices (based on bonding and attaching devices to heat sinks) are typically large in comparison with the heat source in the electronic chip or individual device and as described next offer limited thermal performance improvement.

The efficiency of heat extraction from very small heat sources (such as a channel in a high-electron mobility transistor) critically depends on the ability to spread the heat flow to a larger area, because majority of the temperature drop occurs in the immediate proximity of three-dimensional heat source. A heat spreader (or heat sink) of high thermal conductivity is most efficient when the distance between the heat source and the heat spreader is smaller than the lateral dimension of the heat source. The heat sources in electronic devices are typically several micrometers wide, while the wafers on which these devices are grown are at least 100 um thick. This means that when wafers with such devices are mounted on heat sinks, this above-mentioned efficiency condition is generally not met. One exception to this structure is the case when the devices are mounted upside down on heat sinks, but this approach increases the manufacturing process complexity and is used only in limited number of situations.

It is clear therefore that there is a need in the industry to provide means for high-efficient thermal management of high-power devices by providing means to integrate electronic devices with very highly conductive materials, such as, synthetic diamond.

This invention discloses such devices and processes.

SUMMARY OF THE INVENTION

The present invention relates to a process for producing thin single-crystal semiconductor-material film of predetermined thickness atomically attached to synthetic diamond substrate in which said semiconductor film is detached or "peeled" from a host bulk-semiconductor substrate and remains attached to the new synthetic diamond substrate. As a result, the host bulk-semiconductor substrate is thinner by the amount approximately equal to the removed film thickness and after suitable surface cleaning and preparation is available to be re-used in the same process again, namely, another thin film of predetermined thickness can be removed from its surface. The invented process results in a composite substrate comprising high-quality single-crystal semiconductor films atomically attached to highly thermally conductive and electrically insulating substrates at a per-substrate cost that is a fraction of the same semiconductor layers made in bulk form or built on a compatible bulk host wafer. The invented method can be applied to other crystals for which bulk wafers exist, but the bulk wafer cost is high or the wafer availability is limited. The thickness of the thin single-crystal semiconductor material films varies from several nanometers to several micrometers.

Specifically, the invention relates to the production of thin films of bulk-quality gallium nitride on synthetic diamond substrates wherein synthetic diamond is grown by chemical vapor deposition method. The thin films of bulk-quality gallium nitride may be "peeled" from commercially available bulk gallium nitride wafers, but may also be "peeled" directly from bulk gallium nitride boules to reduce kerf loss.

Additionally, the only way to take full advantage of a high-thermally conductive material as a heat spreader is to integrate this material just below the heat source by atomic bonding or attachment. Two example ways in which the high thermal conductivity material can be integrated are by atomic bonding or attachment. In other words, to use a highly thermally-conductive substrate that is positioned within a few nanometers to a few micrometer of the heat source. In this invention, the distance between the heat source and the diamond heat spreader may be as low as several tens of nanometers, which is typically less than the size of the heat source. This is the optimal approach to thermal management of semiconductor devices.

Bulk Gallium Nitride

The dislocation density in bulk gallium nitride wafers can reach as low as 1.0E4 cm-2 and is hence significantly lower than dislocation density exhibited by layers of gallium nitride grown on present-day substrates like sapphire, silicon, and silicon carbide, where defect density can be as high as 1.0E9 cm-2. The low dislocation density is suitable and hence highly desired today, for the manufacture of high-performance semiconductor devices.

In traditional bulk growth, such as is used for silicon crystal growth, the crystal is grown from a melt into a boule of single crystal. This boule, which for silicon can weigh several tons, is then cut into wafers. The requirement of high vapor pressure of nitrogen at the melting temperature of gallium nitride makes growth from a melt impractical and other methods have been investigated for this purpose. One method of growing bulk GaN is hydride vapor phase epitaxy (HVPE) and it has been used to successfully demonstrate optical and electrical devices on such bulk gallium nitride wafers.

The present disadvantage of bulk GaN growth is that the boules are significantly smaller than those used to grow silicon or gallium arsenide due to process limitations. Consequently, the number of wafers per boule is significantly smaller than for other semiconductors for which the boules are produced from melts. Each wafer of bulk GaN today costs almost one hundred times more than the conventional substrates used for GaN growth or other III-V semiconductors, such as, gallium arsenide. Hence, each electronic or optical device coming from such a wafer carries a significant cost of substrate material (the bulk GaN wafer). It is further quite inefficient that most of the wafer is not being used to manufacture devices, it is used only as a support, i.e., a substrate. Namely, only the top surface of the gallium nitride wafer is used for growing active devices; the vast majority of the wafer volume is used as a carrier and not for its electronic properties—it is hence wasted.

The invented process comprises atomically attaching a synthetic diamond layer or layers to the surface of bulk GaN wafer that has been specially prepared by ion implantation and then "peeling" off a thin layer of bulk-quality GaN that is adjacent to the synthetic diamond layer(s) from the bulk GaN wafer. The remaining bulk GaN substrate, after suitable cleaning and polishing, can be reused to peel another layer off the surface. In this way almost all of the bulk-grown GaN in the substrate is being used for growth and creation of high-performance devices, resulting substantially lower cost per device wafer and substantially higher quality GaN films available for device manufacturing that conventional methods in which GaN is grown on lattice-mismatched substrates (eg. sapphire and silicon).

Synthetic Diamond

There are various methods manufacturing synthetic diamond. The two most important are: High Pressure High Temperature (HPHT) method, which creates bulk crystals, and chemical vapor deposition (CVD), which is generally used to create films [15]. In the latter technology, employed in this invention, carbon plasma is created above a substrate resulting in carbon atoms depositing to form diamond. The energy source for the deposition may involve microwave plasma, high-voltage arc, hot filament, or a combination of any listed methods. The deposition uses a gas carbon source (most often methane) and hydrogen, occurs at a pressure of several thousand Pa, and an elevated substrate temperature exceeding 400° C. Synthetic diamond deposited by chemical-vapor deposition for the purpose of this application may be polycrystalline. This material has thermal conductivity similar to that of single crystal diamond. In the CVD process a substrate on top of which synthetic diamond is to be deposited is placed in a vacuum chamber, where methane and hydrogen are introduced and activated using either microwave plasma, hot filament, or a high-voltage arc. The deposition of diamond in chemical vapor deposition depends strongly on temperature. The higher the temperature, the faster the growth. At 500° C. the growth rates of hot-filament CVD diamond range can be below 1000 nm per hour, while above 800° C. the growth rate may reach several hundred micrometers per hour [15].

The growth of synthetic diamond includes a nucleation phase in which conditions on the surface of the substrate are adjusted to enhance the formation of diamond crystals on the surface. There is a number of ways of nucleating diamond growth on a substrate: scratching the surface with a fine diamond powder, biasing the substrate against the hot filament (used to in the CVD process), implanting the surface with a variety of species, or by depositing a thin film that adheres well to the host substrate and is known to efficiently nucleate diamond on top of the substrate. A nucleation density greater than 1.0E7 nuclei/cm2 is desirable. Examples of deposited thin nucleating-layer materials are amorphous silicon nitride and amorphous silicon carbide. Other amorphous or polycrystalline materials may be used without the departing from the scope of the present invention. Examples are silicon and other wide-gap semiconductor materials. Rather than depositing the nucleation layer in a separate process step, the surface may be prepared for synthetic diamond nucleation by ending the growth of a wide-gap semiconductor layered structure with a layer specifically formed to nucleate synthetic diamond. The choice of materials is a wide-gap semiconductor, such as, aluminum nitride or silicon carbide, that may be crystalline or polycrystalline. An improper choice of nucleating film results in highly stressed films, large grain size and low nucleation density. Surface roughness is an important parameter determining the adhesion of the nucleation layer and the nucleation process itself.

Polycrystalline synthetic-diamond layers are electrically insulating and highly thermally conductive, and hence such substrates are desired in the semiconductor industry as heat spreaders, heat sinks and substrates for the manufacture of high-speed and high-power electronic devices. The high electrical resistivity of the synthetic diamond is advantageous for high-frequency devices because it provides a substrate with low conductive losses.

Implantation of GaN

The separation of the thin film of predetermined thickness from the bulk of the gallium nitride substrate (or boule) is accomplished by creating a layer within the body of the gallium nitride substrate at a predetermined depth away from the surface in which the crystal is weakened by damage induced by ion implantation. The damaged layer defines two regions in the original bulk crystal: the first is the region in gallium nitride between the top surface and the damaged layer (referred to as the "thin film"), while the second region is the remaining bulk of crystal below the damaged layer. Similar approach to damage is used in silicon-on-insulator manufacturing [12].

Reports of creating amorphous and porous gallium nitride [4] imply that implantation of various species at very high dosages especially light atoms, such as hydrogen, are able to create bubbles and voids within the gallium nitride crystal. The presence of the bubbles which coalesce into larger voids as it becomes energetically favorable weakens the crystal. When aided by temperature and external forces the thin film of material will detach from the bulk substrate along the weakened layer. The detachment is aided by both the forces from within the crystal and from the outside.

The thickness of the detached (and transferred) thin gallium nitride film is determined by the range of implanted species into gallium nitride. The depth of the peak implanted ion distribution determines the location of highest concentration of damage. The crystal will break along the depth that is substantially determined by the peak concentration of the implanted species. The desired thickness of the detached film can range from 10 nm to 1000 nm, and depending on the implanted species and energy. The creation of porous GaN and GaN with gas bubbles is possible with high dose implantation of hydrogen and nitrogen [7]. It is preferred that the atoms implanted are light atoms, i.e., generally of the order of or lighter than the atoms forming the lattice (gallium and nitrogen) not to damage and/or erode the surface of gallium nitride wafer. The implanted species include hydrogen, other gas ions, and noble gases, such as, helium. Implantation angle less than 10° relative to a principal crystal axis is preferred in order to limit surface damage [3] (most common axis in hexagonal GaN is the c-axis). For hydrogen, for an example, the implantation of more than 1% atomic hydrogen in the lattice results in the appearance of bubbles [4], and hence concentrations higher than that are necessary to allow detachment. Atomic density of GaN is 9E10 cm-3, which means that hydrogen peak density will have to exceed 1E12 cm-3. FIG. 5 shows an example of a SRIM [9] calculation for a structure that includes silicon nitride and diamond layers on top of the gallium nitride (described later) implanted with 100 keV hydrogen atoms. It shows that such high level of hydrogen concentration is possible with implant dosage in the neighborhood of 1E17 cm-3 and above. In case of hydrogen implantation, the bubbles are believed to result from hydrogen-passivated nitrogen terminated surfaces. FIG. 4 shows the projected range and straggle for hydrogen in GaN, diamond, and silicon nitride.

Once implanted, hydrogen can be redistributed and/or lost if the wafer is exposed to high temperature [6] for a prolonged period of time, and also may detach due to stress induced by the gasses in bubbles. Considering these limitations, it is necessary to manage the thermal processing of implanted wafers.

In one embodiment of the present invention, the surface of the gallium nitride is coated prior to the implantation and before the deposition of diamond layers. The reasons are the following: The subsequent steps involve processes at elevated temperatures (in excess of 600° C.). The decomposition of the GaN surface begins at temperatures above 600° C. with significant loss occurring around 900° C., and can be prevented by depositing a suitable surface coating. Also, the coating of GaN prevents the decomposition of the gallium nitride surface during long and high-dose implants [8]. This is especially true if the implant is carried out at an elevated substrate temperature. Finally, the synthetic diamond deposition requires a surface preparation to efficiently nucleate. This is most easily realized by coating the surface with a suitable amorphous material, such as, silicon nitride. In one embodiment, the GaN is coated with at least one nucleating layer. In another embodiment, the coating prior to implantation comprises a silicon nitride layer followed by a synthetic diamond layer.

The detachment of the thin gallium nitride film requires a balance between forces pulling the crystal apart and the forces pushing it apart. The pushing is accomplished by the expansion of voids and bubble at elevated temperature, while the pull is accomplished by thermal and intrinsic stresses exerted by the synthetic diamond layer. The breakage occurs along the weakened layer with the bubble at the prescribed depth in the bulk of gallium nitride. The forces pulling the thin film off the substrate and the maintaining of the film's mechanical integrity are provided by the adhesion of the synthetic diamond to the gallium nitride film via the intermediate nucleation layer. The detachment may occur during the growth of the synthetic diamond.

The growth of the synthetic diamond layers is adapted to meet several constraints: (a) The growth rate of the majority of the diamond layers has to be high (greater than 1 µm/hr) to be practical. (b) The growth temperature has to prevent the premature detachment of the thin gallium nitride film. Premature means that the film detaches before the diamond layer is sufficiently thick to maintain the film's mechanical integrity through the entire growth. (c) The growth temperature has to be adjusted so as not to allow significant loss of hydrogen or other gasses from the implanted areas. For these reasons, the growth of diamond is may be split into more than one step.

In one embodiment, a thin initial layer of synthetic diamond is grown prior to the implantation and then a stiffening layer and then a bulk layer of diamond are grown after the implantation. The diamond growth is nucleated prior to the implantation under conditions that facilitate quality nucleation and initial rigidity of the diamond film. The initial diamond layer can be as thin as several nanometers, but its stability improves with the thickness hence thicknesses of several micrometers are possible. Diamond thickness of 150 nm was used to simulate the hydrogen implantation profile for this embodiment in FIG. 5. The conditions for growth of the diamond stiffener layer are adjusted so that the temperature does not impact the implanted species or the detachment of the gallium nitride film. This means keeping the temperature below 600° C. and a low growth rate. The thickness of the diamond stiffener layer is determined by the desired rigidity of the diamond layer prior to raising the temperature for high growth rate step: the stiffener layer may be several micrometers thick. The conditions for growing the bulk diamond layer are optimized for high growth rate and consequently higher temperature (above 600° C.). The majority of the diamond layer (the "bulk" of the new substrate) is grown during this stage.

Without departing from the invention, it is possible to change the CVD energy source, namely, is possible to change the deposition process method between these three diamond layers. In one embodiment, microwave plasma is used at low temperature for the stiffener diamond layer, while hot filament is used for the initial and the bulk layers. In another embodiment, it is possible to maintain a single or a combination of methods and implement a gradual change of temperature from the stiffener diamond layer to the bulk diamond layers. In embodiment, the stiffener and the bulk layers become one composite layer referred to as a bulk diamond layer.

In another embodiment, the synthetic diamond growth commences with the stiffener diamond layer after the implantation at a temperature and method that sustains the stability of the thin GaN film. This means growing a low-temperature diamond (<600 C) for at least some of the growth time, and then raising the temperature to a higher growth rate to grow the bulk diamond layer. For example, microwave plasma is used at low temperature to growth the first one or more micrometers of the diamond ("stiffener diamond layer") and then a different method and/or higher temperature is used to increase the growth rate during the later stage ("bulk diamond layer").

Any of the diamond growth techniques described above may be used to nucleate and growth the synthetic diamond without departing from the spirit of the invention. During the growth or the cool down stage of the diamond layers the diamond layers will detach the GaN thin film. The two substrates are then separated and separately further processed. The separation of the two structures occurs for several reasons: (a) Diamond layers have a lower thermal expansion coefficient than gallium nitride wafer and hence during cooling the gallium nitride wafer contracts more than the diamond layers. This stress breaks the wafer along the weaker damaged layer. The temperature at which this happens is above 800° C. (b) Under the effect of the pressure of the gas within the voids and the coalescing of the void under pressure and temperature the semiconductor film detaches.

Thin Film Processing

The surface of the thin GaN film on diamond is now prepared for further processing as ultimately optical or electronic devices will be manufactured on it. The surface remains rough and contaminated and/or reconstructed with a high concentration of the implanted species after the detachment process. The root-mean-square roughness preferred for gallium nitride crystal growth is below 0.5 nm. This level of smoothness is regularly achieved with chemical-mechanical polish (CMP) of the gallium nitride surface. Implanted species are known to either create deep levels or passivate the shallow dopants in gallium nitride and hence adversely impact the electronic and optical properties of the semiconductor films. Similar effects arise from the presence of remaining damage to the crystal lattice caused by detachment or high-dose implant. To avoid implant related damage, roughness and contamination, the damaged material around the GaN thin film broken-off surface of gallium nitride is removed prior to further processing. This task is accomplished by a combination of chemical mechanical polish (CMP), ion milling, and heat treatment to out-diffuse the dopants. The out-diffusion requires protection of the GaN surface with a layer of nitride or similar inert amorphous film that will prevent surface decomposition while the species outgas. Finally, the surface is subjected to an alternating sequence of oxidation and oxide removal steps, which results in a clear surface ready for epitaxial growth.

Processing of the Remaining Substrate

The surface of the remaining substrate is rough and contaminated with implanted species in much the same manner as the previously described thin film of gallium nitride. The cleanup and smoothing processes are basically the same as described above for the thin gallium nitride film. However, the requirement on the finished surface roughness is different: This surface must be ready for the deposition of another nucleation layer and hence larger surface roughness is desired. A root-mean-square roughness of more than 1 nm is preferred to provide greater adhesion to silicon nitride or similar materials. The removal of excess implanted species is required in order to prevent adversely impacting the adhesion of the new nucleation layer.

Once cleaned and polished, the remaining gallium nitride substrate is inserted again into the process at the beginning.

In other embodiments, the presented process is applied to the creation of GaAs, InP, SiC, and other semiconductor thin films on synthetic diamond.

BRIEF DESCRIPTION OF THE DRAWINGS

FIG. 1—Method for producing thin film of semiconductor film on a synthetic diamond substrate FIG. 2—Cleaning and smoothing of thin film of semiconductor film on a synthetic diamond substrate FIG. 3—Cleaning and surface preparation of remaining substrate for nucleation of diamond.

DETAILED DESCRIPTION OF THE INVENTION

Figure 2:
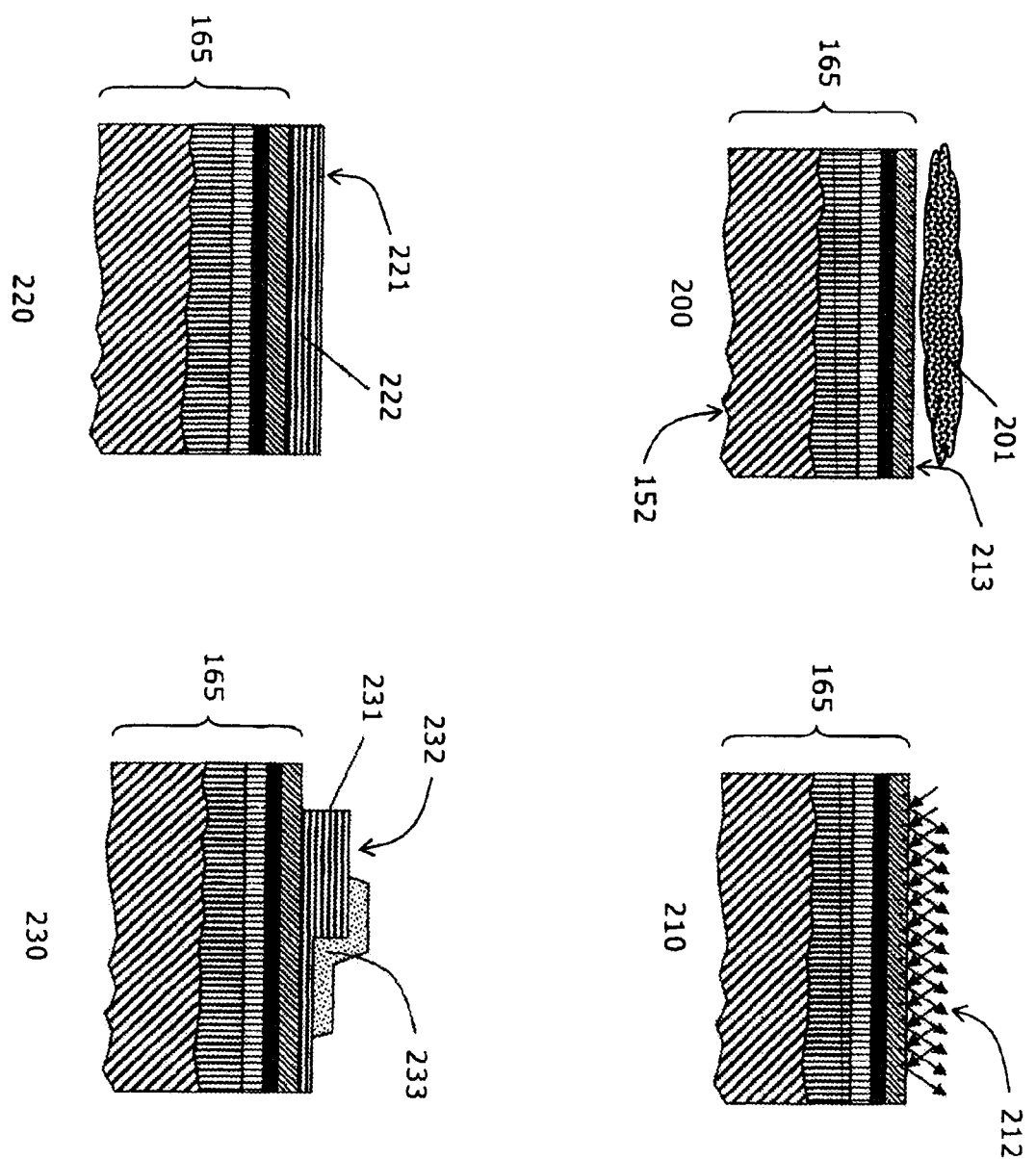
Figure 3:
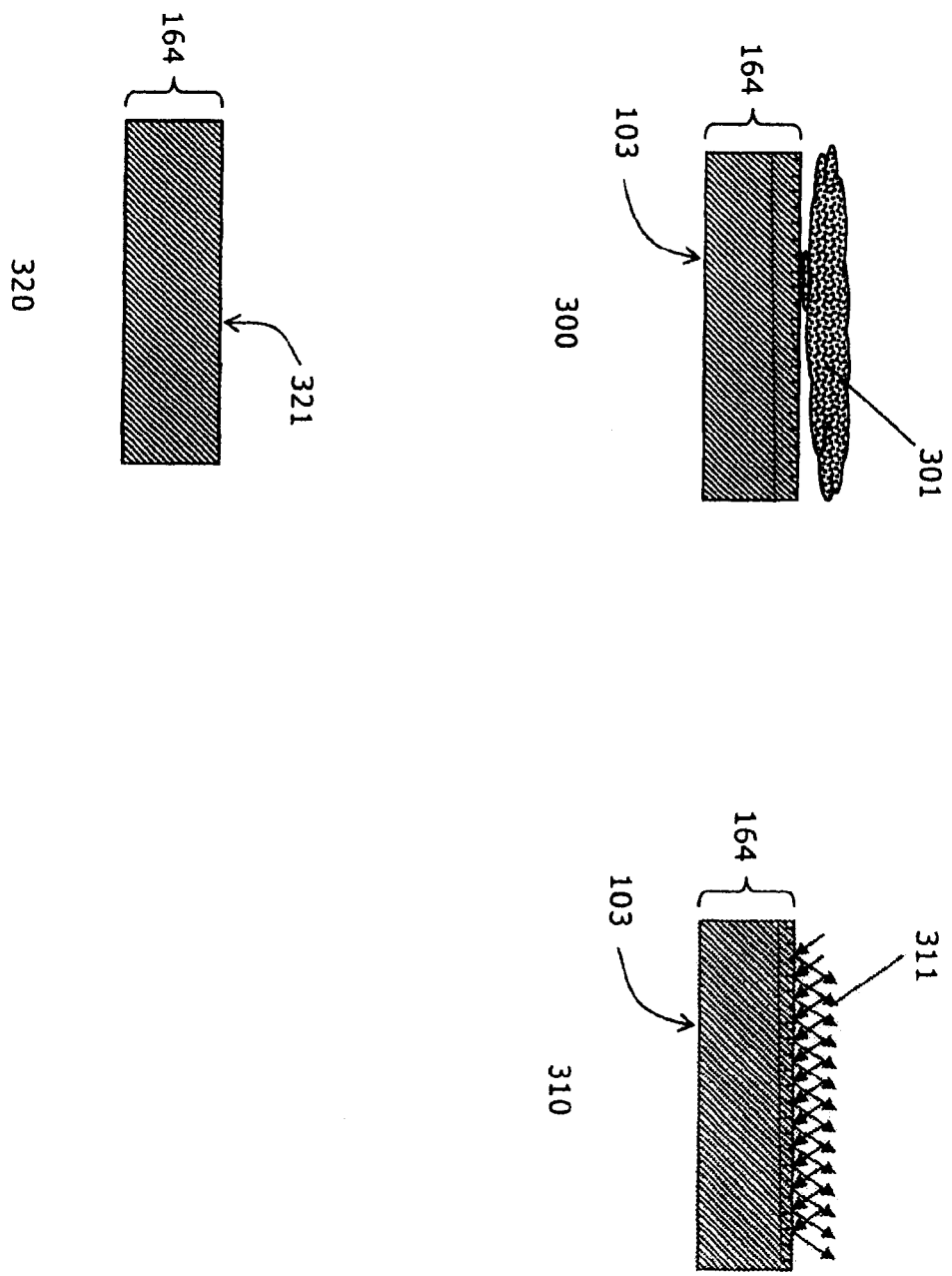

The preferred process according to this invention and various embodiments comprise of the following step described below and illustrated in FIGS. 1, 2 and 3. The process flow is given in FIG. 7a.

Figure 7A:
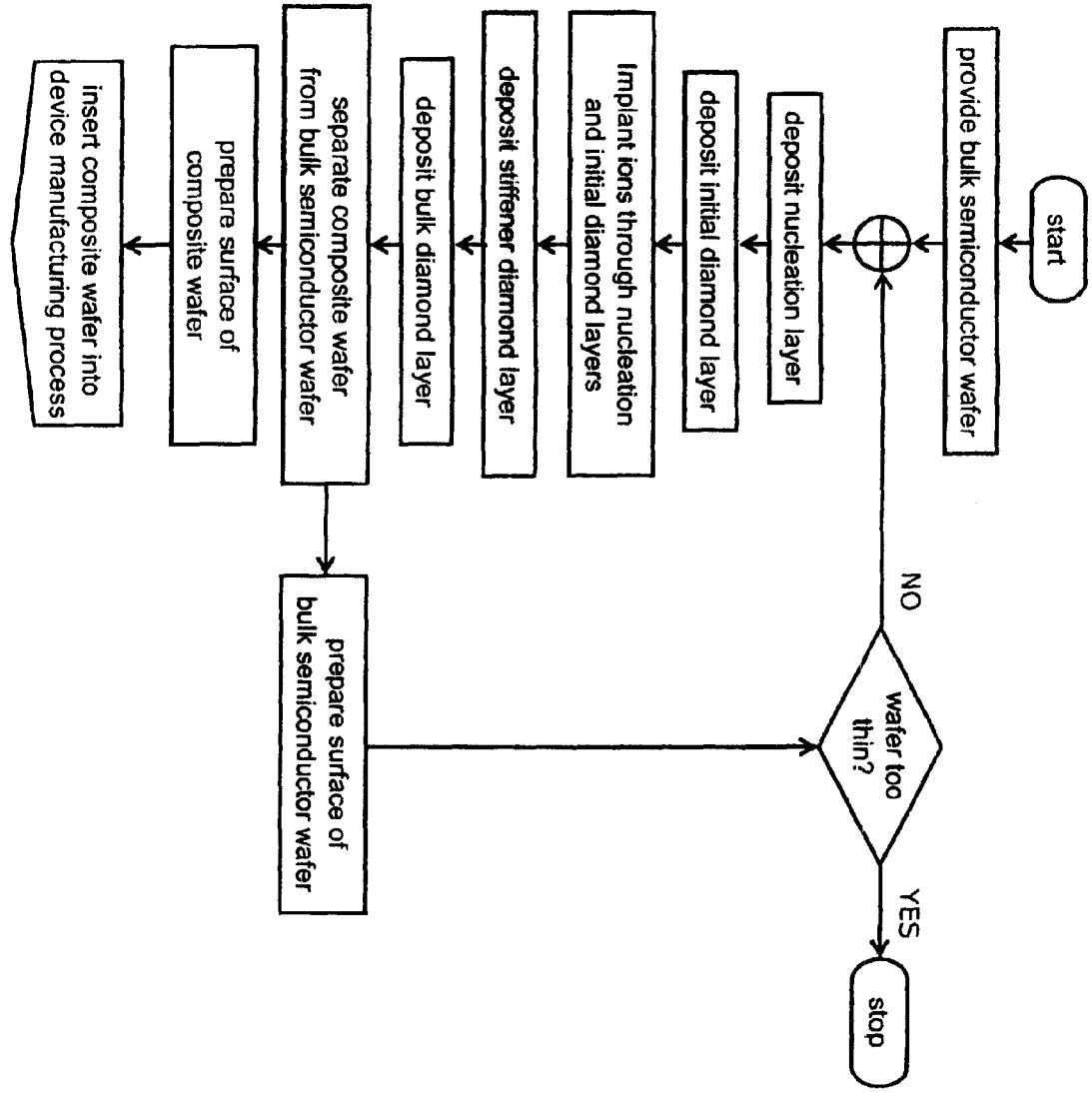
FIG. 7—Three embodiments (a-c) of the preferred method of the manufacture of thin bulk-quality semiconductor films.

The first embodiment of the preferred method is illustrated in FIG. 7a and described more specifically in FIG. 1: In step 100 of FIG. 1, a bulk gallium nitride wafer 101 is provided. The wafer 101 has a planar surface 102 and whose plane is either substantially parallel or slightly inclined with respect to one of the principal crystallographic planes of a single-crystal semiconductor material.

In the next step 110, the surface 102 of the gallium nitride substrate is prepared for diamond nucleation by depositing a layer 111. This requires high adhesion. Hence, surface 102 is prepared by polishing. The preferred root-mean-square roughness of surface 102 is at least 1 nm. The surface preparation required in this step 110 is equivalent to the one described in the last steps of the recycled gallium nitride wafer cleaning 300 through 320 (described later). The back surface 103 of the wafer 101 may or may not be polished.

In step 110, a nucleation layer 111 is deposited on surface 102 of the wafer 101. The purpose of the nucleation layer is to facilitate the efficient nucleation and growth of CVD diamond in a later step. The selection of nucleating-layer material and its thickness is based on its ability to serve as a nucleating layer for synthetic diamond growth, the quality of its adhesion to gallium nitride, its thermal conductivity and expansion coefficients.

Figure 4:
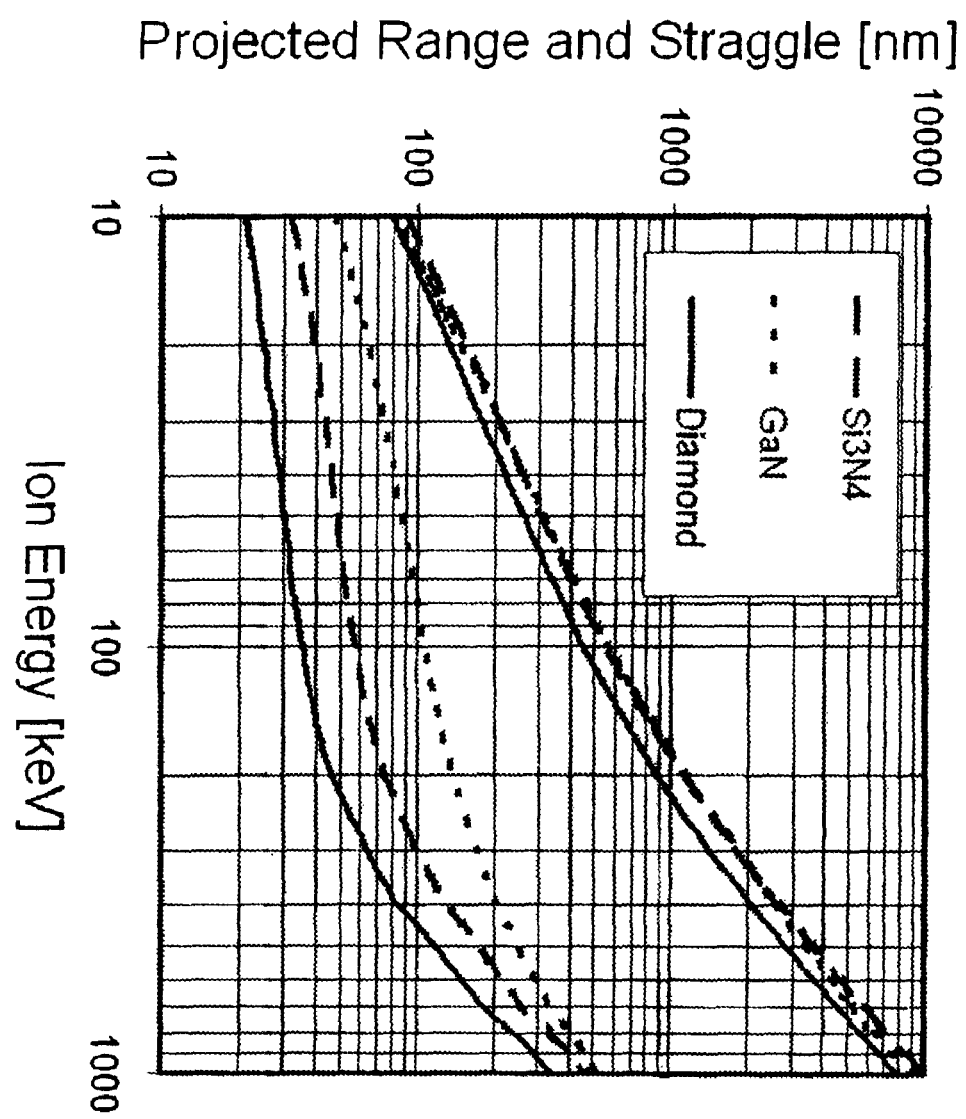
FIG. 4—Theoretical projected range and longitudinal straggle for hydrogen implanted into silicon nitride, gallium nitride, and diamond FIG. 5—Theoretical hydrogen atom implant profile for 100 keV implant energy. A dose of 1E17 cm-2 with this profile produces 1% atomic density of hydrogen in the gallium nitride.
Figure 5:
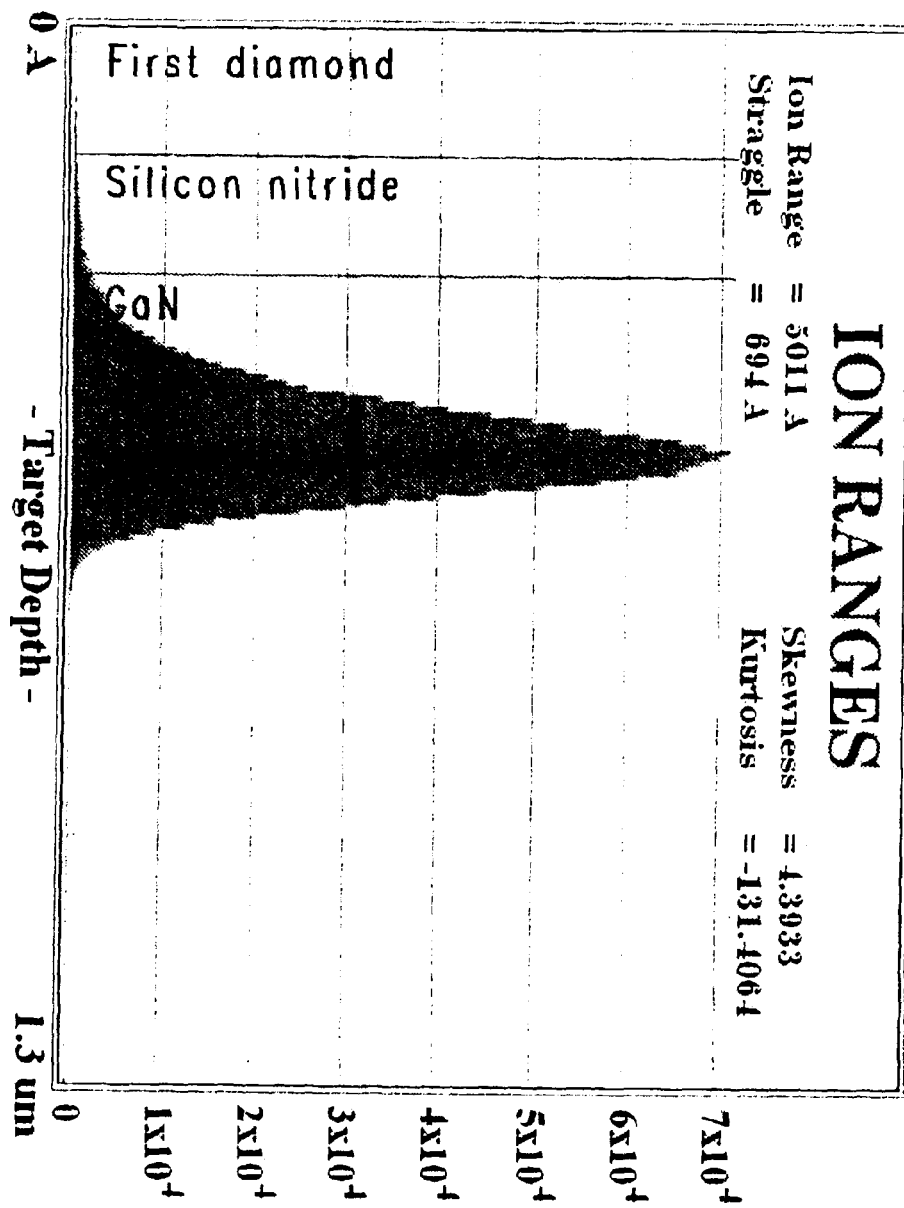

The thickness of the nucleation layer 111 is determined by several requirements. (a) Silicon nitride and other materials that may be used for nucleation have thermal conductivities that are significantly lower that than of synthetic diamond. When the designer of the composite wafer structure desires devices with high thermal conductance, then the upper bound on the thickness of the nucleation layer is set by the allowed temperature drop under device operation. (b) Due to the difference in thermal expansion coefficient and the intrinsic stress embedded during the film deposition, the nucleation layer must not be so thick as to fail under the strain and temperature cycling of subsequent processes. (c) In a later process step hydrogen ions or other noble gas ions will be implanted through the nucleation layer and the stopping power of the nucleation layer has to be considered in the design. FIG. 4 shows the expected projected ranges and longitudinal straggle for hydrogen implanted into diamond, silicon nitride and gallium nitride calculated using commercial available Monte Carlo simulation program SRIM [9]. It shows that silicon nitride's stopping power is commensurate with GaN and hence the thickness of silicon nitride should be subtracted from the desired depth of implant into the GaN bulk substrate. For reasons (b) and (c), thinner films are preferred.

In one embodiment the nucleation layer is made out of amorphous silicon nitride deposited using reactive sputtering. In another embodiment the nucleation layer is made out of one of the following materials: thermally deposited silicon nitride, amorphous silicon dioxide, polycrystalline silicon, and amorphous silicon deposited by reactive ion sputtering, thermal evaporation, or electron beam deposition. In another embodiment, the nucleation layer is a composite layered structure involving more than one material mentioned above. This embodiment is advantageous to separate the requirement for adhesion from the requirement for chemical-vapor deposited synthetic diamond. In one such embodiment, the nucleation layer comprises a layer of amorphous silicon that adheres to GaN and a layer of silicon nitride that promotes synthetic diamond. Any method for thin film deposition that results in dense films that are thermally stable up to 1100° C. may be used. The film thickness ranges between 10 nm and 200 nm. The top surface of the nucleation layer is denoted by 112.

In step 120, an initial layer 121 of synthetic diamond is deposited by chemical vapor deposition on top of surface 112. In one embodiment, the initial layer is deposited using the hot filament technique at an elevated temperature close to 800° C. The hot filament technique is used because it produces a higher quality adhesion and nucleation of the synthetic diamond film over a large area.

The thickness of the initial diamond layer 121 is determined by several requirements. The lower limit on the thickness is determined by the ability of the initial diamond layer to adhere to the nucleation layer below and the film being able to maintain its mechanical integrity during the subsequent processes (strain and temperature cycling). Since in a later process step hydrogen ions or other gas ions will be implanted through the nucleation layer and this initial diamond layer, the stopping power of the layer combination must be considered in the design—this places the upped bound on the initial diamond layer and nucleation layer combination. FIG. 4 shows that diamond layers are expected to have smaller stopping power than either gallium nitride or silicon nitride and hence a thicker first diamond layer may be placed on top of the nucleation layer. Thinner films are generally preferred. The initial diamond film thickness is greater than 20 nm, typically, around 200 nm, but may be as thick as 1000 nm. The top surface of the initial diamond layer is denoted with 122. In one embodiment, in-situ optical measurement of film roughness is used to stop the growth of the initial diamond layer at a suitable time to enable proper surface structure for the implantation in the next step.

In step 130, the structure from process step 120 is further processed by implanting ions 131 from the side of surface 122, through the initial diamond layer 121 and the nucleation layer 111. The implanted species are preferably hydrogen or hydrogen with a noble gas, such as, helium. Other gases may be used. The ions 131 create a layer of microscopic damage and voids 132 of finite thickness in the volume of wafer 101 at a depth close to the average penetration depth 133. The depth of implantation 133 defines the thickness of the resulting thin film 134 of GaN that will be left on the diamond substrate and the remaining substrate 135. The film thickness is defined by the implantation conditions and can vary from 10 nm to more than a micrometer for implantation energies from 10 to 100 keV. To minimize the damage to the surface the implantation may be carried out at an elevated wafer 101 temperature above 100° C. In the case of hydrogen, the peak implant ion atomic content within the gallium nitride has to exceed 1% and approach 10% for the gallium nitride layer (in a later step) to be able to detach.

In step 140, a stiffener diamond layer 141 is deposited onto surface 122 using chemical vapor deposition. The surface 122 of the initial layer lends itself to efficient nucleation as it is already made out of synthetic diamond. The energy source and deposition conditions during the stiffener diamond layer are adjusted so that mechanical integrity of the gallium nitride and the implant below are not altered during the growth of this layer (say, at temperatures below 600° C.). In one embodiment the deposition of the stiffener diamond layer 141 uses microwave plasma. In another embodiment the stiffener diamond layer 141 is deposited using hot filament as the energy source in CVD. In one embodiment, the stiffener diamond layer 141 is deposited using hot filament as the energy source in CVD, while an in-situ filament temperature measurement is used to control diamond growth rate and film stress.

Figure 6:
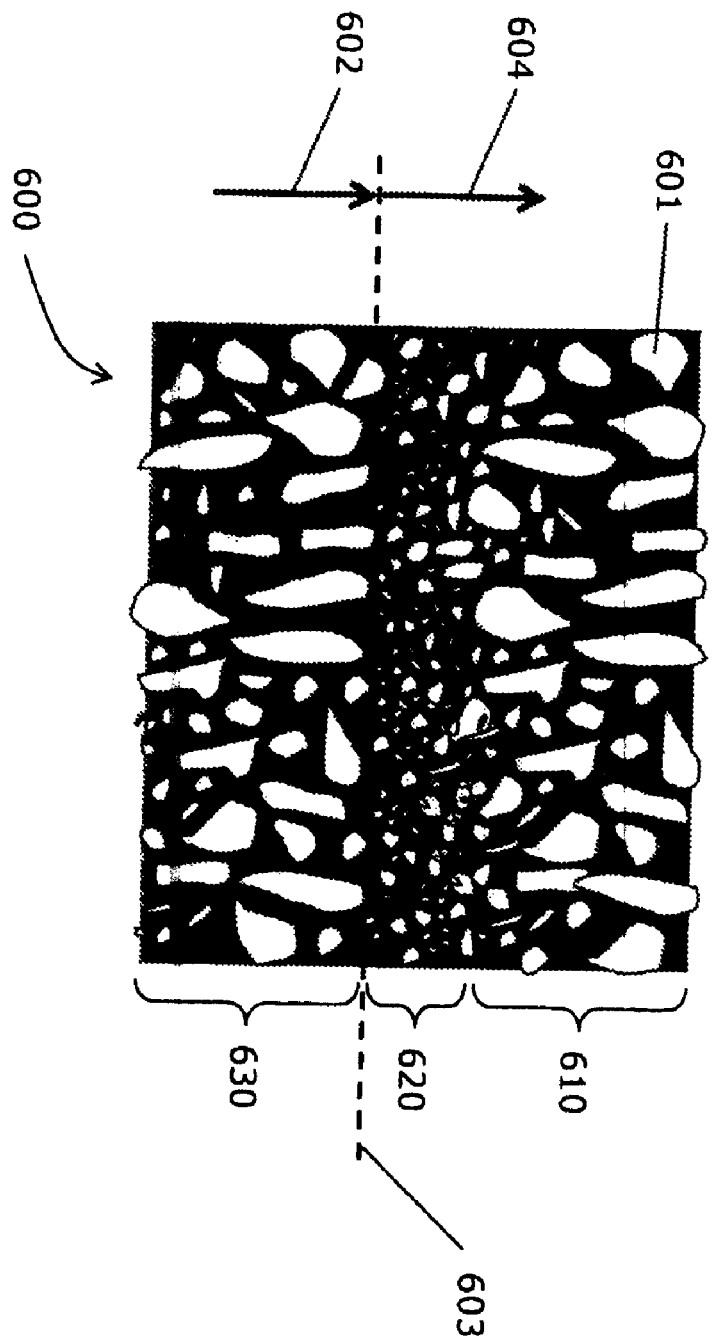
FIG. 6—Illustration of the size of CVD diamond grains during an interrupted growth: As the thickness of the diamond progresses the grains get larger, but they start small when the growth is restarted.

The interrupted growth of CVD diamond (namely, growth of the stiffener layer on top of the initial layer, and later, eventual growth of the bulk diamond layer on top of the stiffener diamond layer) leaves a signature that can be observed in a cross-sectional view of such a structure using cross-sectional transmission-electron microscope or similar tools known in the art: The grain size of the CVD diamond changes with the growth time [13], [14]. Upon nucleation the grain size is small, and then it grows. The rule-of-thumb is that the grain size and the surface roughness of the diamond film is about 10% of the total film thickness. When growth is interrupted, the grain size starts from small, again. Therefore, growth interruption can be identified in the film cross-section as an abrupt change in the diamond grain size. FIG. 6 is an illustration of a cross-sectional view of a CVD diamond layers that underwent an interrupted growth. A layered structure 600 was created by growing CVD diamond in the direction indicated with arrow 602. The large and small white areas 601 in FIG. 6 represent diamond grains and their size in different areas of structure 600. The growth was interrupted when the diamond layer 630 reached the thickness indicated with the dashed line 603. The surface after the first growth will be referred to as surface 603 and its position indicated with the dashed line 603. Growth interruption comprises turning off the energy source in the CVD process, turning of the source or carbon, or taking the wafer out of the chamber. The growth is subsequently continued on the surface 603 in the direction shown by arrow 604. The CVD diamond is nucleated on the surface 603 with smaller grain size: The grain size in the region 630 below surface 603 is larger than the grain size in the region 620 just above the surface 603. Region 620 represents first CVD diamond grown on surface 603. As the growth proceeds in direction 604, the diamond grain size increases and eventually, in region 610, becomes comparable to the grain size in region 630 and may continue to become larger is growth is continued. The illustration in FIG. 6 and references [13] and [14] describe the CVD diamond interrupted growth signature. The typical grain size in the beginning of CVD diamond growth is in the neighborhood of 10 nm, while before the interruption the grain size may be more than several hundreds of nanometers. Note that the FIG. 6 illustration is not to scale.

In step 150, the bulk diamond layer 151 is deposited at an elevated temperature (>600° C.). The thickness of completed bulk diamond layer ranges from several tens of micrometers to several hundred micrometers depending on the desired diamond substrate thickness. The resulting structure 153 is a composite structure which, during the thermal treatment of diamond growth and subsequent cooling, separates into two parts. The growth of the bulk diamond layer on top of the stiffener layer has the signature of CVD diamond interrupted growth in which the grain size changes as described in step 150 and FIG. 6.

In step 160, the separation of the structure 153 occurs. This is illustrated in step 160 with two arrows 161. The separation results in two parts: (a) composite wafer 165 that contains a thin gallium nitride film 166 attached to a diamond substrate and has a revealed gallium nitride surface 162, and (b) remaining gallium nitride substrate 164 with revealed surface 163.

In step 170, the composite wafer 165, in which a thin gallium nitride layer is atomically attached to a substrate comprising of nucleation layer and at least one layer of synthetic diamond, is ready for further processing. The top surface 162 is the gallium nitride surface, while the bottom surface 152 is made out of synthetic diamond. The composite wafer 165 is will be cleaned and prepared for further processing in steps 200-230.

In step 180, the remaining gallium nitride wafer 164 with top surface 163 and back 2 surface 103 is ready to be re-inserted into the process stage 110 after it has gone through cleaning and surface preparation described in process steps 300 though 330.

In steps 300, 310, and 320, the remaining gallium nitride wafer 164 is cleaned and polished again to be recycled. The surface 163 is rough and contaminated with a high concentration of the implanted species after the detachment process. Majority of the roughness, contamination, and damage at the broken-off surface of gallium nitride must be removed prior to recycling the wafer. This task is performed by first driving out the remaining impurities by out-diffusion at an elevated temperature approaching 1000° C. shown with cloud 301 in step 300, followed by chemical mechanical polish (CMP) shown with arrows 311 in step 310. The surface 321 of the new gallium nitride wafer must be ready for the deposition of another nucleation layer with high adhesion energy and hence some surface roughness is desired. The desired root-mean-square roughness of surface 321 is at least 10 nm. This is sufficient to provide good adhesion to silicon nitride or similar materials. The removal of excess implanted species in step 300 is required in order to avoid adversely impacting the adhesion of the new nucleation layer.

In step 200, the surface 162 of the thin GaN film 166 is now prepared for further processing to serve as a base for optical or electronic device. The surface 162 is left rough and contaminated and/or reconstructed with a high concentration of the implanted species after the detachment process. The roughness, contamination, and damage at the broken-off surface of gallium nitride is removed prior to further processing using first by driving out any remaining dopants shown with the cloud 201 in step 200. In case of hydrogen implantation this may not be necessary if the separation has occurred already during the bulk diamond layer deposition. In one embodiment, during the out-diffusion the GaN surface 213 is coated with a layer of silicon nitride or similar inert amorphous film (not shown in step 200) that will prevent the surface decomposition while the species outgas. The roughness and damage is removed in step 210 by chemical mechanical polish (CMP) indicated by the arrows 212. In one embodiment (not shown in step 210), to aid the removal of damage and dopants, the surface may be subjected to an alternating sequence of oxidation and oxide removal steps, and ion milling to clear the surface 29 and prepare it for epitaxial growth.

In step 220, on the cleaned surface 213, new gallium nitride or related compound semiconductor epitaxial layers 222 are grown using any of the methods known in the art, for example, metal-organic chemical-vapor deposition. The ending surface of these new epitaxial layers is denoted with 221.

Step 230 illustrates the manufacturing of electronic or optical devices out of newly grown layers 222 and on top of surface 221. The manufacturing steps include, but are not limited to etching, which produces walls 231, deposition of metals 233, or other dielectrics to define optical or electronic devices. In one embodiment, the new epitaxial layers 222 comprise a basis for a high-electron mobility transistor. In another embodiment, the newly grown layers 222 comprise a basis for a light-emitting diode or diodes. In yet another embodiment, the newly grown layers 222 comprise a basis for a variety of electronic and optical devices, such as, high-electron mobility transistors, heterojunction bipolar transistors, phototransistors, power-electronic devices (thyristors, triacs), as are known in the art.

Figure 7B:
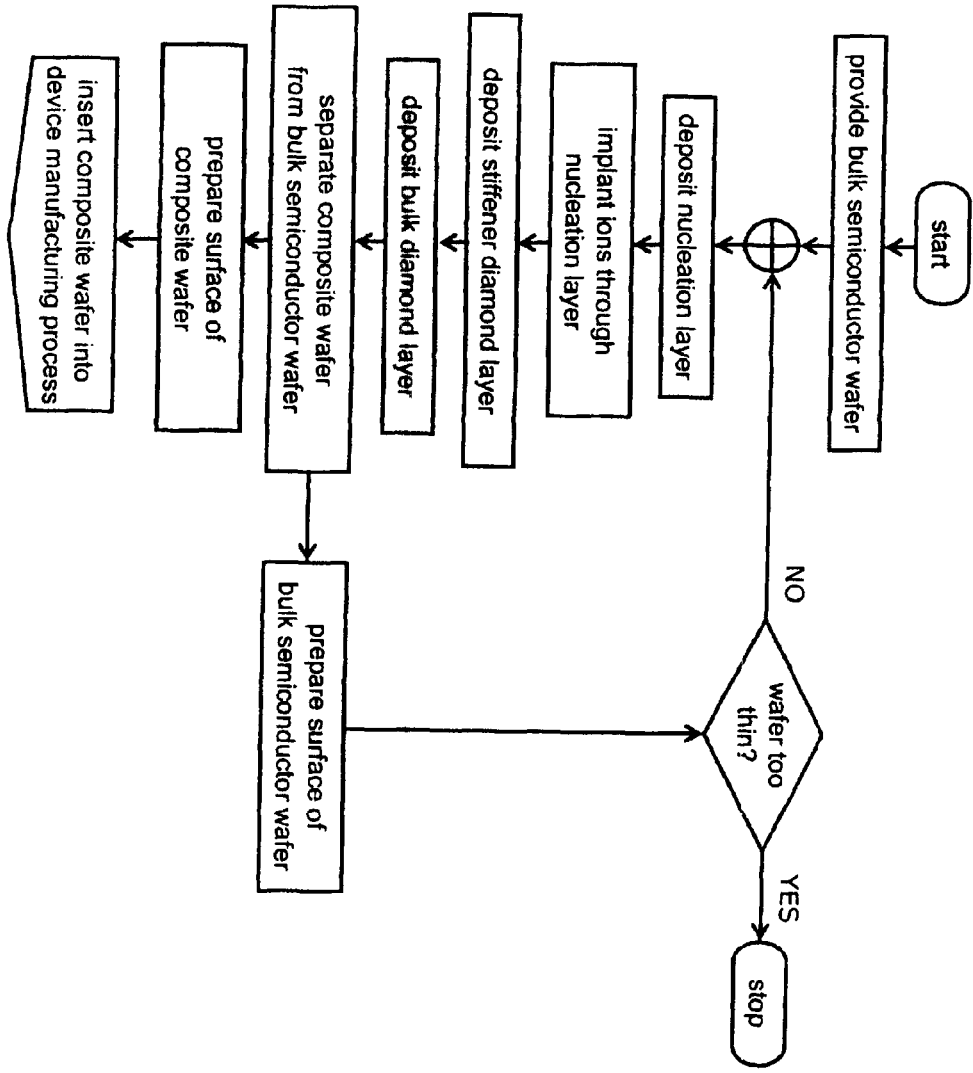

Another embodiment of the preferred method is illustrated in FIG. 7b. This embodiment is different from the process disclosed in FIG. 7a in that the implantation (step 130) occurs immediately after the deposition of the nucleation layer (step 110) and this in this case the stiffener diamond layer (step 140) is deposited under conditions that ensure high adhesion and mechanical integrity of the implanted surface and the thin film of bulk gallium nitride.

Figure 7C:
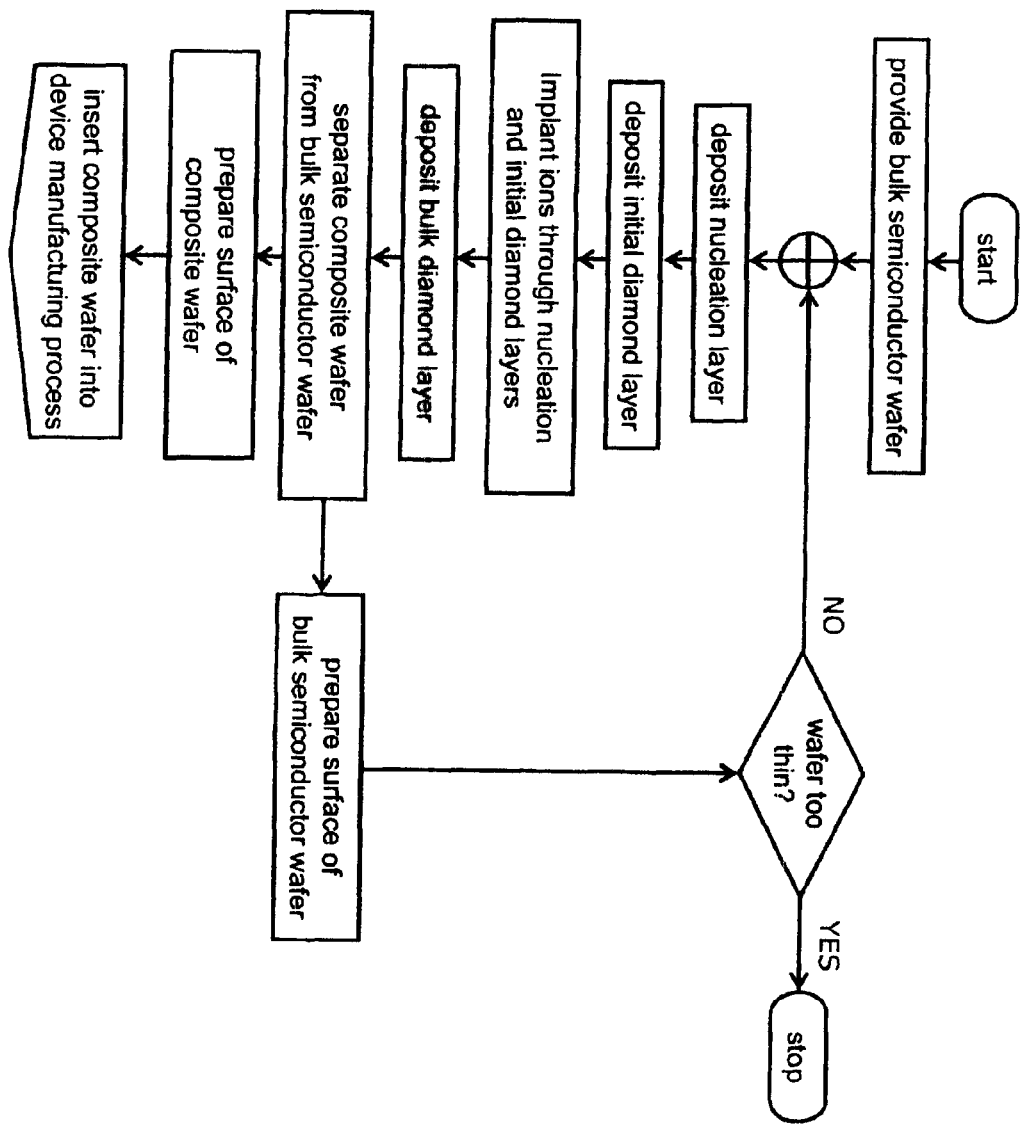
Figure 8:
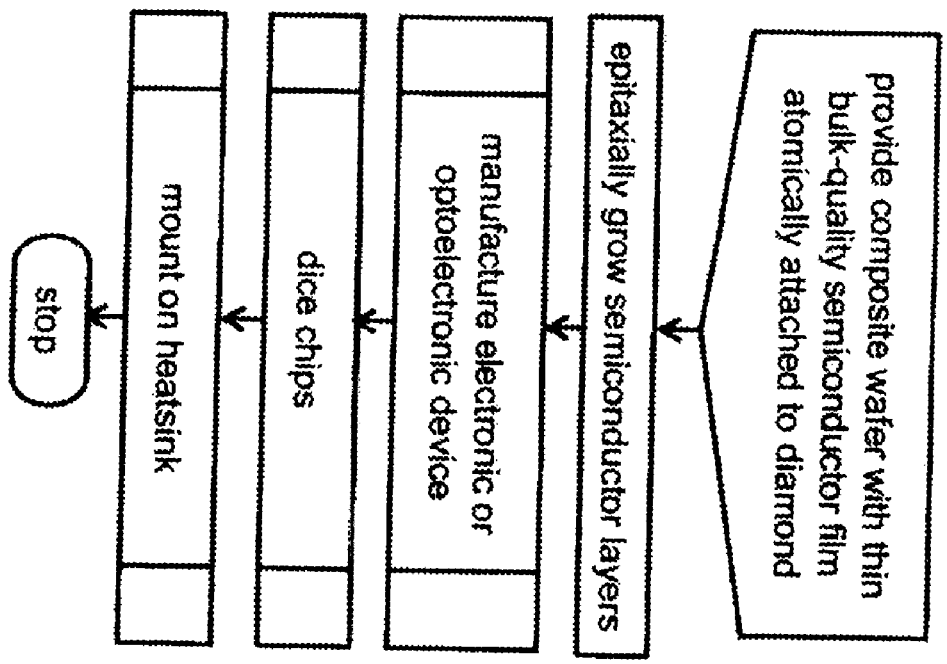
FIG. 8—Use of composite wafers manufactured in accordance with the present invention in standard semiconductor-device manufacturing processes.

Another embodiment of the preferred method is illustrated in FIG. 7c. This embodiment is different from the process disclosed in FIG. 7a in that the stiffener diamond layer and the bulk diamond layer are deposited sequentially as a part of a single process in which the conditions for diamond deposition are changing during the growth. This diamond deposition step is collectively referred to as "bulk diamond" growth in FIG. 7c.

The completed composite wafer with thin semiconductor film attached to synthetic diamond is inserted into a standard semiconductor-device fabrication process. Within this process, illustrated in FIG. 9, new semiconductor films may be grown on top of the thin semiconductor film followed by standard processes that are know in the art of electronic and optoelectronic device manufacturing. The completed device remains mounted on the synthetic diamond heat spreader and can be mounted for efficient cooling onto another heat sink (made out of copper, synthetic diamond, or other suitable material) and directly into its final location as a part of a larger system (in a package or mounted directly onto another chip or mechanical harness).

Figure 9:
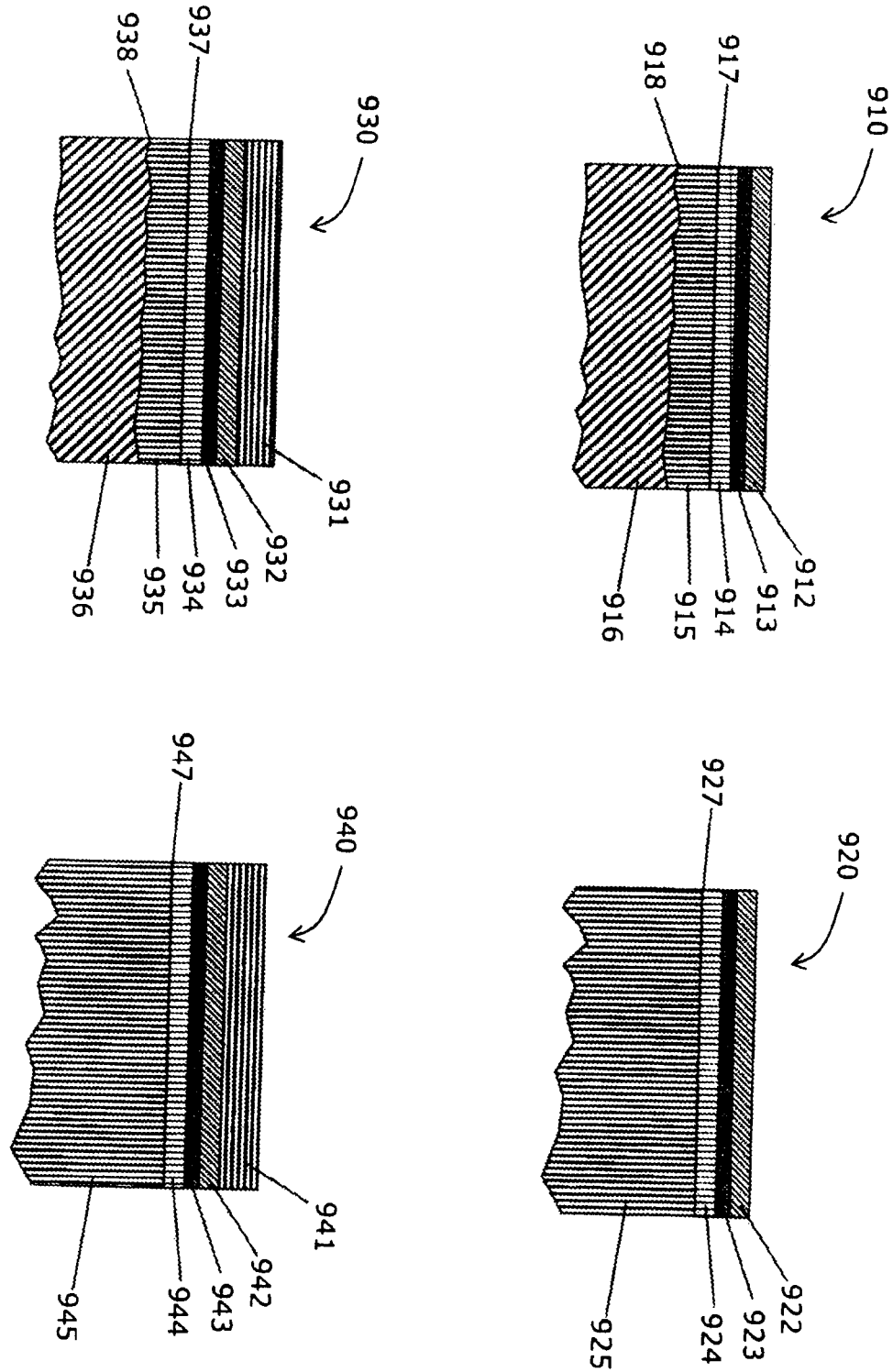
FIG. 9—Four embodiments of completed composite wafers in accordance with present invention.

FIG. 9 shows four embodiments of completed composite wafers in accordance with present invention. Composite wafer 910 comprises a thin film of bulk-grown gallium nitride 912, a nucleating layer 913, initial diamond layer 914, stiffener diamond layer 915, and bulk diamond layer 916. The interface 917 between initial diamond layer 914 and the stiffener diamond layer 915 and the interface 918 between the stiffener diamond 914 and the bulk diamond 916 are due to interrupted growth of diamond. The composite wafer may be mounted on another substrate without departing from the spirit of the invention. The surface of topmost layer 912 (gallium nitride) may be processed to fabricate optical or electronic devices.

Composite wafer 920 comprises a thin film of bulk-grown gallium nitride 922, a nucleating layer 923, initial diamond layer 924, and bulk diamond layer 925. The interface 927 between initial diamond layer 914 and the bulk diamond 916 is due to interrupted growth of diamond. The composite wafer may be mounted on another substrate without departing from the spirit of the invention.

Composite wafer 930 comprises an epitaxially grown semiconductor layered structure 931, a thin film of bulk-grown gallium nitride 932, a nucleating layer 933, initial diamond layer 934, stiffener diamond layer 935, and bulk diamond layer 936. The interface 937 between initial diamond layer 934 and the stiffener diamond layer 935 and the interface 938 between the stiffener diamond 935 and the bulk diamond 936 are due to interrupted growth of diamond. The composite wafer may be mounted on another substrate without departing from the spirit of the invention. The topmost layer 931 may contain gallium nitride, aluminum nitride, indium nitride, or any combination of mentioned nitride compound. The top (revealed) surface of the layer 931 may be processed to fabricate optical or electronic devices.

Composite wafer 940 comprises an epitaxially grown semiconductor layered structure 941, a thin film of bulk-grown gallium nitride 942, a nucleating layer 943, initial diamond layer 944, and bulk diamond layer 945. The interface 947 between initial diamond layer 944 and the bulk diamond 945 is due to interrupted growth of diamond. The composite wafer may be mounted on another substrate without departing from the spirit of the invention. The topmost layered structure 941 may contain gallium nitride, aluminum nitride, indium nitride, or any combination of mentioned nitride compounds. The top (revealed) surface of the layer 941 may be processed to fabricate optical or electronic devices.

It is apparent that the above embodiments may be altered in many ways without departing from the scope of the invention. It is understood that although the preferred method is been disclosed as applied to gallium nitride films and bulk gallium nitride wafers, other single-crystal semiconductors can be processed using the same invented approach without departing from the scope of the invention. Further, various aspects of a particular embodiment may contain patentable subject matter without regard to other aspects of the same embodiment. Additionally, various aspects of different embodiments can be combined together. Also, those skilled in the art will understand that variations can be made in the number and arrangement of components illustrated in the above diagrams. It is intended that the appended claims include such changes and modifications.

While certain representative embodiments and details have been shown for purposes of illustrating the invention, it will be apparent to those skilled in the art that various changes in the methods and apparatus disclosed herein may be made without departing from the scope of the invention which is defined in the appended claims.

What is claimed is:

1. A method for preparation of thin semiconductor film, comprising the steps of:
providing a semiconductor wafer with a first surface and second surface;
disposing a nucleation layer on said first surface, said nucleation layer having a first surface and a second surface, said second surface of said nucleation layer being proximal to said semiconductor wafer;
disposing a first layer of synthetic diamond on top of said nucleation layer, said first layer of synthetic diamond having a first surface and a second surface, said second surface of said first layer of synthetic diamond being proximal to said semiconductor wafer;
implanting ions into said semiconductor wafer through said nucleation layer and said first layer of synthetic diamond to create in the volume of said semiconductor wafer at a depth close to the average penetration depth of said ions, a layer of damage; said layer of damage defining a film region and a bulk region in said semiconductor wafer, said film region being disposed between said layer of damage and said nucleation layer, said bulk region disposed between said layer of damage and said second surface of said semiconductor wafer;

depositing a second layer of synthetic diamond on said first layer of synthetic diamond;

separating said film region from said bulk region of said semiconductor wafer.

2. The method of claim 1 wherein said semiconductor wafer is composed of a material selected from the group consisting of gallium nitride, gallium arsenide, indium phosphide, and silicon carbide.

3. A method of recycling semiconductor wafers comprising the steps of:

providing a semiconductor crystal, said semiconductor crystal having a surface;

depositing a nucleation layer on said surface of said semiconductor crystal;

depositing an initial layer of synthetic diamond on top of said nucleation layer;

implanting ions into said semiconductor crystal through said nucleation layer and said initial layer of synthetic diamond, said ions creating a layer of damage in the body of said semiconductor crystal, said layer of damage defining a film region and a bulk region in said semiconductor crystal;

depositing a stiffener layer of synthetic diamond on top of said initial layer of synthetic diamond, said stiffener layer of synthetic diamond, said initial layer of synthetic diamond, said nucleation layer, and said film region forming a composite wafer;

detaching said composite wafer from said bulk region of said semiconductor crystal, said bulk region of said semiconductor crystal having a revealed surface; and repeating said method by inserting said bulk region of said semiconductor crystal as a semiconductor crystal in said step of providing a semiconductor crystal.

4. The method of claim 3, wherein said semiconductor crystal is comprised of gallium nitride.

5. The method of claim 3, wherein said semiconductor crystal is a boule comprised of gallium nitride.

6. The method of claim 3, wherein said semiconductor crystal is a wafer comprised of gallium nitride.

7. The method of claim 4, wherein said nucleation layer is comprised of silicon nitride.

8. The method of claim 3, wherein said initial layer of synthetic diamond is deposited at a process temperature above below 600° C.

9. The method of claim 3, wherein said stiffener layer of synthetic diamond is deposited at a process temperature below 600° C.

10. The method of claim 3, wherein said nucleation layer has a thickness not exceeding 130 nm.

11. The method of claim 3, wherein said initial diamond layer has a thickness and a surface roughness determined using an in-situ optical reflectometer.

12. A method of recycling semiconductor wafers comprising the steps of:

providing a semiconductor crystal, said semiconductor crystal having a surface;

depositing a nucleation layer on said surface of said semiconductor crystal;

depositing an initial layer of synthetic diamond on top of said nucleation layer;

implanting ions into said semiconductor crystal through said nucleation layer and said initial layer of synthetic diamond, said ions creating a layer of damage in the body of said semiconductor crystal, said layer of damage defining a film region and a bulk region in said semiconductor crystal;

depositing a stiffener layer of synthetic diamond on top of said initial layer of synthetic diamond, said stiffener layer of diamond deposited at a temperature lower than 600° C.;

disposing a bulk layer of synthetic diamond, said bulk layer of synthetic diamond, said stiffener layer of synthetic diamond, said initial layer of synthetic diamond, said nucleation layer, and said film region forming a composite wafer;

detaching said composite wafer from said bulk region of said semiconductor crystal, said bulk region of said semiconductor crystal having a revealed surface; and repeating said method by inserting said bulk region of said semiconductor crystal as a semiconductor crystal in said step of providing a semiconductor crystal.

13. The method of claim 12, wherein said semiconductor crystal is comprised of gallium nitride.

14. The method of claim 12, wherein said semiconductor crystal is a boule comprised of gallium nitride.

15. The method of claim 12, wherein said semiconductor crystal is a wafer comprised of gallium nitride.

16. The method of claim 13, wherein said nucleation layer is comprised of silicon nitride.

17. The method of claim 12, wherein said initial layer of synthetic diamond is deposited at a process temperature below 600° C.

18. The method of claim 12, wherein said stiffener layer of synthetic diamond is deposited at a process temperature below 600° C.

19. The method of claim 12, wherein said nucleation layer has a thickness not exceeding 130 nm.

20. The method of claim 12, wherein said initial diamond layer has a thickness and a surface roughness determined using an in-situ optical reflectometer.

21. The method of claim 2, wherein said semiconductor wafer is composed of gallium nitride.

22. The method of claim 21, wherein said ions are selected from the group consisting of hydrogen molecule ions, protons, helium ions, and noble gas ions.

23. The method of claim 21, wherein the ion implantation dose exceeds 1E17 cm-2.

24. The method of claim 21, wherein said nucleation layer comprises amorphous silicon nitride.

25. The method of claim 21, wherein said first layer of synthetic diamond is deposited at a process temperature below 600° C.

26. The method of claim 21, wherein said second layer of synthetic diamond is deposited at a process temperature below 600° C.

27. The method of claim 3, further comprising the step of polishing said revealed surface of said bulk semiconductor crystal.

28. The method of claim 12, further comprising the step of polishing said revealed surface of said bulk semiconductor crystal.

29. The method of claim 12, wherein said bulk layer of synthetic diamond is deposited at a process temperature exceeding 600° C.

* * * * *